United States Patent
Ko

(10) Patent No.: US 7,102,939 B2
(45) Date of Patent: Sep. 5, 2006

(54) SEMICONDUCTOR MEMORY DEVICE HAVING COLUMN ADDRESS PATH THEREIN FOR REDUCING POWER CONSUMPTION

(75) Inventor: Bok-Rim Ko, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 41 days.

(21) Appl. No.: 10/963,744

(22) Filed: Oct. 14, 2004

(65) Prior Publication Data

US 2005/0105363 A1    May 19, 2005

(30) Foreign Application Priority Data

Oct. 14, 2003    (KR) ...................... 10-2003-0071353

(51) Int. Cl.
*G11C 7/00*    (2006.01)
(52) U.S. Cl. .................. 365/194; 365/233; 365/230.08
(58) Field of Classification Search ................ 365/233, 365/194, 230.08
See application file for complete search history.

(56) References Cited

U.S. PATENT DOCUMENTS

| | | | |
|---|---|---|---|
| 6,005,823 A | 12/1999 | Martin et al. | |
| 6,032,220 A | 2/2000 | Martin et al. | |
| 6,091,665 A | 7/2000 | Dorney | |
| 6,094,704 A | 7/2000 | Martin et al. | |
| 6,400,629 B1 | 6/2002 | Barth, Jr. et al. | |
| 6,477,631 B1 | 11/2002 | Martin et al. | |
| 6,483,769 B1* | 11/2002 | La | ............................. 365/233 |
| 6,557,090 B1 | 4/2003 | Ho | |
| 6,563,747 B1 | 5/2003 | Faue | |
| 2002/0051388 A1 | 5/2002 | Martin et al. | |
| 2002/0149992 A1 | 10/2002 | Faue | |
| 2002/0169919 A1 | 11/2002 | Ho | |
| 2003/0063514 A1 | 4/2003 | Faue | |

FOREIGN PATENT DOCUMENTS

JP        09-282881      10/1997

* cited by examiner

*Primary Examiner*—Huan Hoang
(74) *Attorney, Agent, or Firm*—McDermott Will & Emery LLP

(57) ABSTRACT

There is provided a semiconductor memory device capable of reducing power consumption by preventing unnecessary operations of an AL flip-flop delay unit and a CL flip-flop delay unit. The semiconductor memory device includes an internal column address generation means for receiving an external column address and generating an internal column address; a delay means for delaying the internal column address for a predetermined time corresponding to a preset latency; and a driving control means for driving the delay means for the predetermined time corresponding to the preset latency.

17 Claims, 12 Drawing Sheets

SEMICONDUCTOR MEMORY DEVICE HAVING COLUMN ADDRESS PATH THEREIN FOR REDUCING POWER CONSUMPTION

FIELD OF INVENTION

The present invention relates to a semiconductor device; and, more particularly, to a semiconductor memory device having a column address path therein for reducing power consumption.

Description of Prior Art

Generally, in a DDR II SDRAM (double data rate II synchronous dynamic random access memory), a user can input a read command signal or a write command signal at a desired clock within a minimum RAS (row address strobe) to CAS (column address strobe) delay time tRCD after inputting a low active command signal. The user can set a predetermined time at an extended mode register set (EMRS) so that it is possible to control a tRCD time, wherein the predetermined time is taken from the time when the write command signal and the read command signal are received to the time when a read CAS signal and a write CAS signal for an actual internal operation is activated.

An inputted read command signal is activated as a read CAS signal after a predetermined delay time corresponding to an additive latency (AL) which is preset at the EMRS, and an inputted write command signal is activated as a write CAS signal after the predetermined delay time corresponding to a write latency which is also preset at the EMRS. Therefore, a column address which is inputted concurrently with the read command signal and the write command signal has the same predetermined delay time. A column address path of a conventional semiconductor memory device will now be described in detail with reference to the accompanying drawings.

FIG. 1 is a block diagram showing the column address path of the conventional semiconductor memory device.

Referring to FIG. 1, the conventional semiconductor memory device having the column address path therein includes an internal column address generation unit 10, an AL flip-flop delay unit 20, a CL flip-flop delay unit 30, a read (RD) latch unit 40 and a write (WT) latch unit 50. Herein, the internal column address unit 10 receives an external column address Add and generates an internal column address yadd. The AL flip-flop delay unit 20 delays the internal column address yadd for a first predetermined delay time corresponding to the additive latency and outputs an AL address yadd_AL. The CL flip-flop delay unit 30 delays the AL address yadd_AL for a second predetermined delay time corresponding to the CAS latency and outputs a CL address yadd_CL. The RD latch unit 40 latches and outputs the AL address yadd_AL in response to a read CAS signal casp6_rd. The WT latch unit 50 latches and outputs the CL address yadd_CL in response to the write CAS signal casp6_wt.

Meanwhile, the internal column address generation unit 10 has an input buffer unit 12 for converting an inputted external column address into an internal voltage level, an address alignment unit 14 for aligning an address outputted from the input buffer unit 12 in synchronization with an internal clock iclk, a latch unit 16 for holding an output signal of the address alignment unit 14, and a column latch unit 18 for outputting a signal outputted from the latch unit 16 as the internal column address yadd in response to a CAS signal casp6. Furthermore, the address alignment unit 14 is provided with an S/H control unit 14A and an internal clock synchronization unit 14B. The S/H control unit 14A controls a hold time (H) and a setup time (S) and an internal clock synchronization unit 14B synchronizes an output signal of the S/H control unit 14A with the internal clock iclk.

FIG. 2 is a circuit diagram of the AL flip-flop delay unit 20 for use in the conventional semiconductor memory device depicted in FIG. 1.

Referring to FIG. 2, the AL flip-flop delay unit 20 has delay units 22 and 24 which are connected in series in order to delay the inputted signal for one clock. That is, the AL flip-flop delay unit 20 incorporating therein the delay parts 22 and 24 delays the internal column address yadd for a predetermined time corresponding to the additive latency and generate a plurality of AL addresses yadd_AL1 and yadd_AL2. In more detail, each delay unit 22 and 24 is provided with a first transfer gate for transmitting the input signal in case that the internal clock iclk is high level, a first latch for holding an output signal of the first transfer gate, a first inverter for inverting an output signal of the first latch, a second transfer gate for transmitting a signal passing through the first inverter in case that the internal clock iclk is low level, a second latch for holding an outputted signal from the second transfer gate, and a second inverter for inverting an output signal of the second latch.

FIG. 3 is a timing diagram showing an operation of the conventional semiconductor memory device.

Referring to FIG. 3, the AL flip-flop delay unit 20 delays the inputted internal column address yadd for one clock corresponding to the additive latency and outputs a plurality of AL addresses yadd_AL1, yadd_AL2. Additionally, the CL flip-flop delay unit 30 has a similar circuit design and operation to the AL flip-flop delay unit 20 as illustrated in FIGS. 2 and 3. That is, in the CL lip-flop delay unit 30, an input address is the AL address yadd_AL and an output address is the CL address yadd_CL. This is only different from the AL flip-flop delay unit 20 so that further explanation for the CL flip-flop delay unit 30 will be abbreviated herein. It is preferable that the input buffer unit 12 be configured with a current mirror differential amplifier and a latch unit 16 be configured with NOR gates.

An operation of the conventional semiconductor device having the column address path will be described with reference to FIG. 1.

To begin with, the input buffer 12 converts the inputted address Add into an internal power level. Then, the S/H control unit 14A controls the hold time and the setup time, which will be required in a process of synchronizing the inputted address Add with the internal clock iclk. The signal outputted from the internal clock synchronization unit 14B is latched at the latch unit 16 and then outputted as the internal column address yadd through the column latch unit 18 in response to an activated CAS signal casp6.

Thereafter, the internal column address yadd transmitted to the AL flip-flop delay unit 20 is outputted as the AL address yadd_AL with a predetermined delay time corresponding to the additive latency. In addition, the CL flip-flop delay unit 30 receives the AL address yadd_AL and outputs the CL address yadd_CL with a predetermined delay time corresponding to the CAS latency. In case that the read CAS signal casp6_rd is activated, the AL address yadd_AL is outputted as the column address add_col through the RD latch unit 40. On the other hand, when the write CAS signal casp6_wt is activated, the CL address yadd_CL is outputted as the column address add_col through the WT latch unit 50.

In the conventional semiconductor device, the row address and the column address share the same input buffer unit 12, the same address alignment unit 14 and the same latch unit 16. Thus, the row address path and the column address path are divided by a row latch unit (not shown) and the column latch unit 18, respectively. Therefore, the internal column address yadd is generated through the column latch unit 18 which is controlled by the CAS signal casp6, which is activated when the read command signal rd_com and the write command signal wt_com are inputted.

The column address path of the conventional semiconductor memory device has been described above and a description about the row address path will be omitted.

In the conventional semiconductor memory device having the column address path, the internal column address yadd outputted from the internal column address generation unit 10 is outputted as the AL address yadd_AL and the CL address yadd_CL regardless of a read operation or a write operation. Then, the AL address yadd_AL is outputted as the column address add_col through the RD latch unit 40 by means of the activated read CAS signal casp6_rd. On the other hand, the CL address yadd_CL is outputted as the column address add_col through the WT latch unit 50 by means of the activated write CAS signal casp6_wt.

The conventional semiconductor memory device having the column address path, however, has a drawback of unnecessary power consumption. That is, as described above, the AL flip-flop delay unit 20 and the CL flip-flop delay unit 30 keep operating regardless of the read/write operational mode, wherein the AL flip-flop delay unit 20 and the CL flip-flop delay unit 30 perform a counting mode by means of the internal clock iclk. Moreover, the AL flip-flop delay unit 20 and the CL flip-flop delay unit 30 are also operating while the internal clock iclk is toggling, resulting in a large amount of unnecessary power consumption.

SUMMARY OF INVENTION

It is, therefore, an object of the present invention to provide a semiconductor memory device having a column address path for reducing a power consumption by employing an driving control means.

In accordance with an aspect of the present invention, there is provided a semiconductor memory device including: an internal column address generation means for receiving an external column address and generating an internal column address; a delay means for delaying the internal column address for a predetermined time corresponding to a preset latency; and a driving control means for driving the delay means for the predetermined time corresponding to the preset latency.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device having a column address path therein in accordance with the present invention will be described in detail referring to the accompanying drawings.

Figure 4:
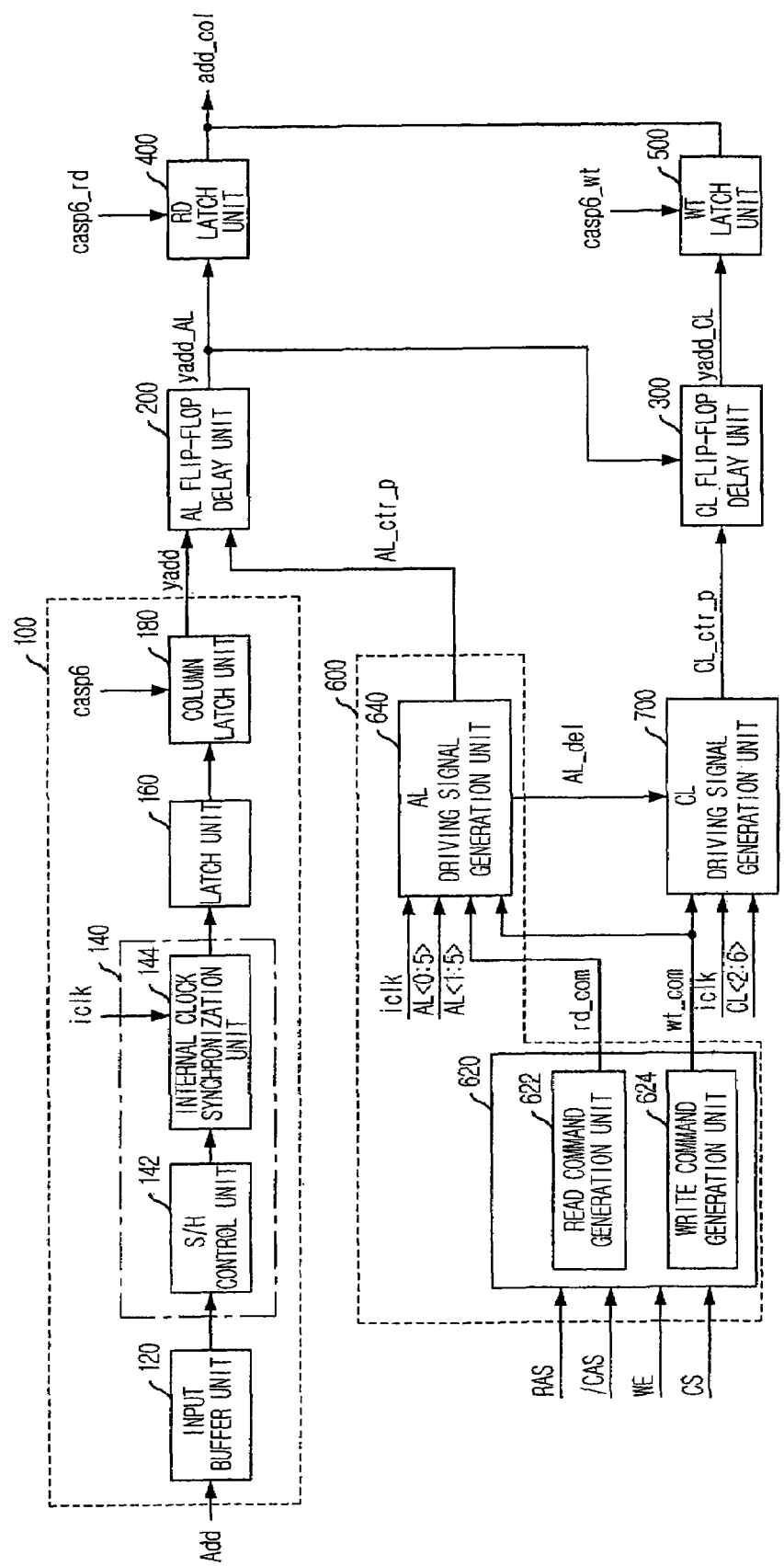
FIG. 4 is a block diagram of a semiconductor memory device having a column address path in accordance with a preferred embodiment of the present invention.

FIG. 4 is a block diagram of a semiconductor memory device having a column address path in accordance with a preferred embodiment of the present invention.

Referring to FIG. 4, the inventive semiconductor memory device having the column address path includes an internal column address generation unit 100, a delay unit 200, 300, a driving control unit 600, 700, a read (RD) latch unit 400 and a write (WT) latch unit 500. Here, the internal column address generation unit 100 converts an external column address Add into an internal column address yadd. The delay unit 200, 300 delays the internal column address yadd and an AL address yadd_AL for a predetermined time corresponding to a preset latency and outputs the AL address yadd_AL and a CL address yadd_CL. The driving control unit 600, 700 drives the delay unit 200, 300 for the predetermined time corresponding to the preset latency. The RD latch unit 400 latches the AL address yadd_AL and outputs a column address add_col in response to a read CAS signal casp6_rd. Meanwhile, the WT latch unit 500 latches the CL address yadd_CL and outputs the column address add_col in response to a write CAS signal casp6_wt.

The delay unit 200, 300 has an AL flip-flop delay unit 200 for delaying the internal column address yadd for a first predetermined time corresponding to an additive latency and outputting the AL address yadd_AL, and a CL flip-flop delay unit 300 for delaying the AL address yadd_AL for a second predetermined time corresponding to a CAS latency and outputting the CL address yadd_CL.

The driving control unit 600, 700 has an AL driving control unit 600 and a CL driving control unit 700, which drive the AL flip-flop delay unit 200 and the CL flip-flop delay unit 300, respectively. In detail, the AL driving control unit 600 plays a role in sampling and applying the internal clock iclk to the AL flip-flop delay unit 200 during the first predetermined time corresponding to the additive latency so that the AL flip-flop delay unit 200 is driven only during the predetermined time corresponding to the additive latency. Likewise, the CL driving control unit 700 plays a role in sampling and applying the internal clock iclk to the CL flip-flop delay unit 300 during the second predetermined time corresponding to the CAS latency so that the CL flip-flop delay unit 300 is driven only during the second predetermined time corresponding to the CAS latency.

Additionally, the AL driving control unit 600 is provided with a command generation unit 620 and an AL driving signal generation unit 640. The command generation unit 620 is configured to generate receive external signals, such as a RAS signal, a CAS bar signal /CAS, a write enable signal WE and a chip select signal CS, and output internal command signals rd_com and wt_com. The AL driving signal generation unit 640 is configured to sample the internal clock iclk during a period corresponding to an AL information signal AL<1:5> in response to the internal commands signals rd_com and wt_com and output an AL driving signal AL_ctr_p. The command generation unit 620 is provided with a read command generation unit 622 for generating the read command signal rd_com and a write command generation unit 624 for receiving the external signal such as the RAS signal, the CAS bar signal /CAS, the WE signal and the CS signal and generating the write command signal wt_com.

Figure 1:
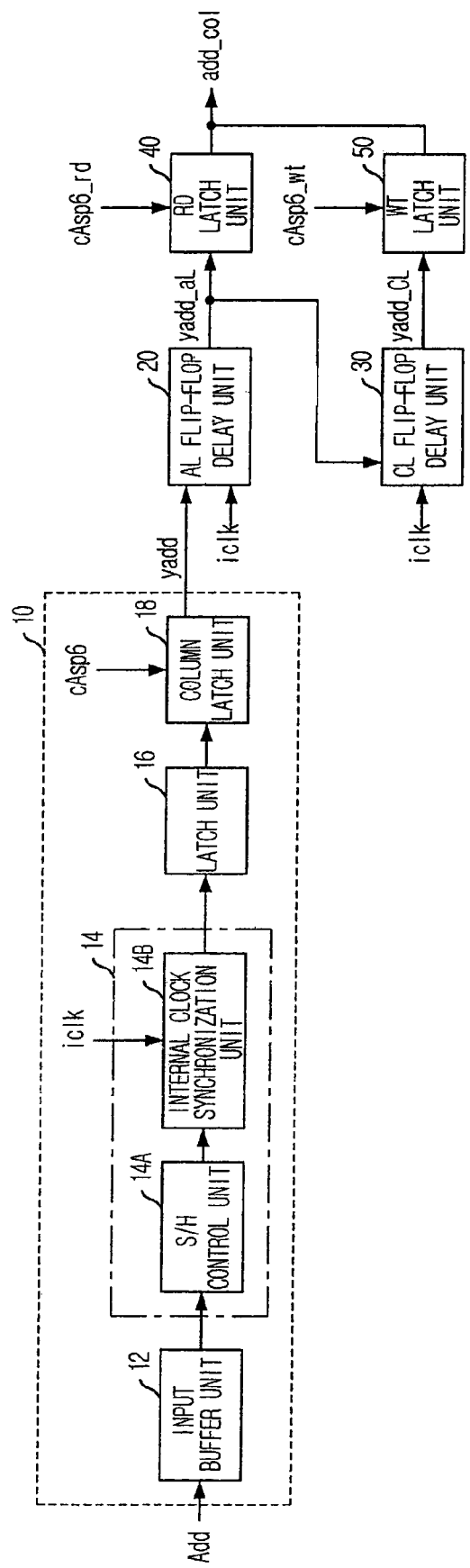
FIG. 1 is a block diagram showing the column address path of the conventional semiconductor memory device.
Figure 2:
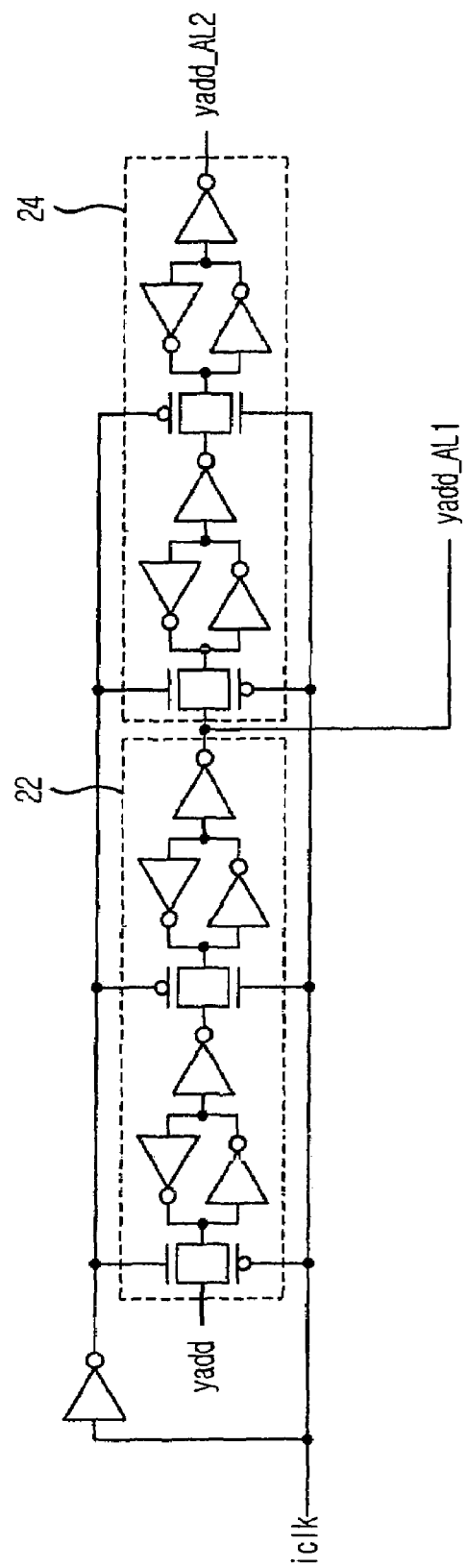
FIG. 2 is a circuit diagram of the AL flip-flop delay unit for use in the conventional semiconductor memory device depicted in FIG. 1.
Figure 3:
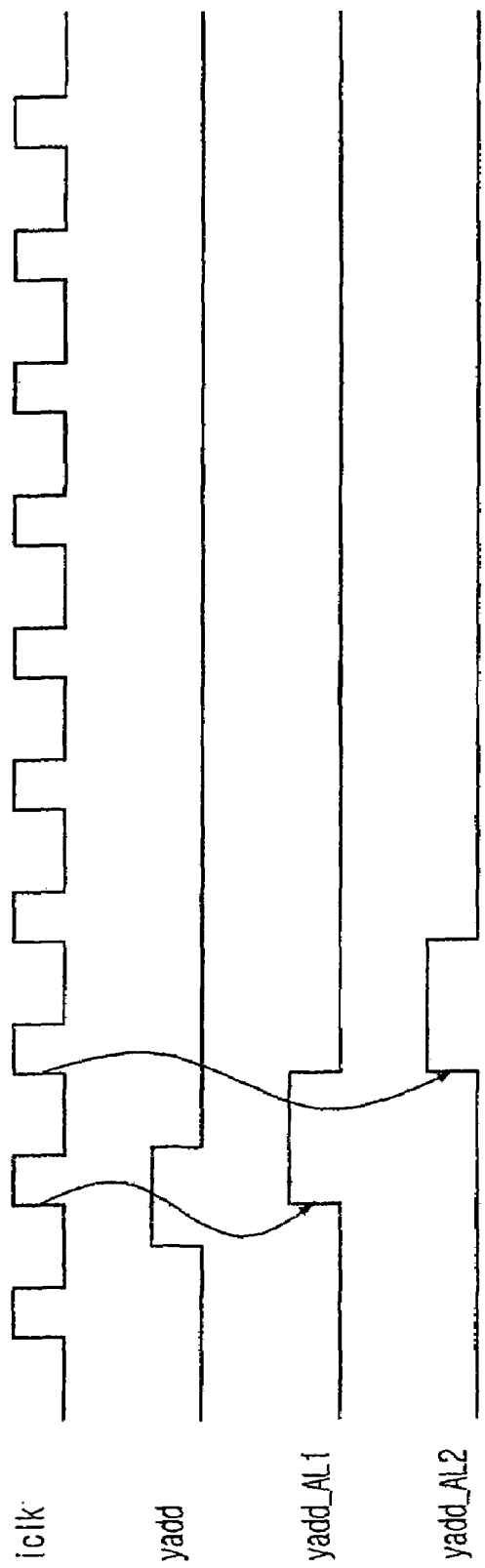
FIG. 3 is a timing diagram illustrating an operation of the conventional semiconductor memory device.

In comparison with the conventional semiconductor memory device as shown in FIG. 1, the elements of the inventive semiconductor memory device are similar to those of the conventional semiconductor memory device, except the AL driving control unit 600 and the CL driving control unit 700. That is, the present invention further includes the AL driving control unit 600 and the CL driving control unit 700 for driving the AL flip-flop delay unit 200 and the CL flip-flop delay unit 300 only during the predetermined periods which respectively correspond to the additive latency and the CAS latency.

Figure 5A:
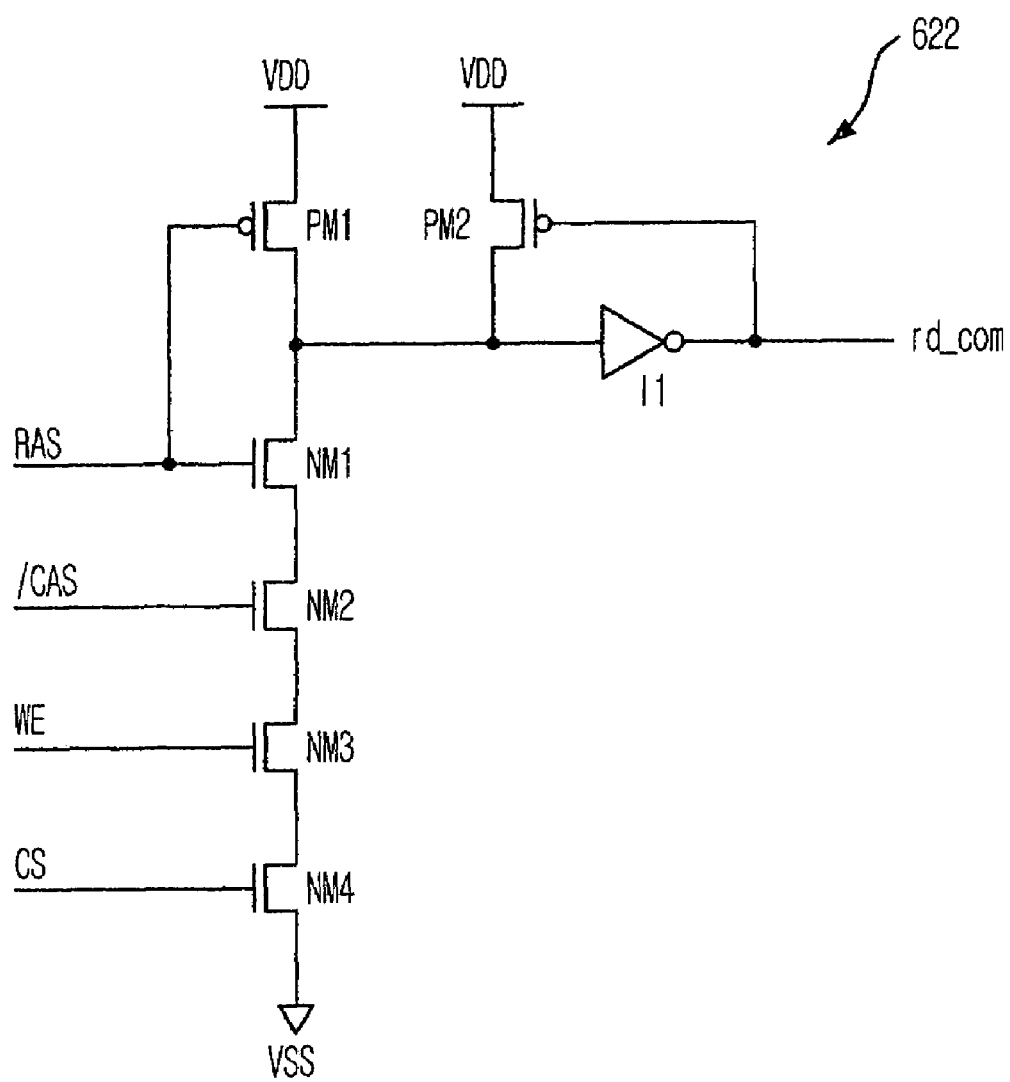
FIG. 5A is a circuit diagram of the read command generation unit in accordance with the present invention.

FIG. 5A is a circuit diagram of the read command generation unit in accordance with the present invention.

Referring to FIG. 5A, the read command generation unit 622 has a first PMOS transistor PM1, an inverter I1, a second PMOS transistor PM2 and a plurality of NMOS transistors NM1 to NM4. Herein, the first PMOS transistor PM1 has a source-to-drain path between a power supply voltage VDD and a node, and a gate of the first PMOS transistor PM1 receives the RAS signal. The inverter I1 inverts a signal applied on the node and outputs the read command signal rd_com. The second PMOS transistor PM2 has a source-to-drain path between the power supply voltage VDD and the node, and a gate of the second PMOS transistor PM2 receives the read command signal rd_com. The NMOS transistors NM1 to NM4 are connected in series between the node and a ground voltage VSS. Gates of the NMOS transistors NM1 to NM4 receive the RAS signal, the CAS bar signal /CAS, the write enable signal WE and the chip select signal CS, respectively. In the read command generation unit 622, in case that the RAS signal, the WE signal and the CS signal are high level and the CAS bar signal /CAS is low level, the read command signal rd_com is activated.

Figure 5B:
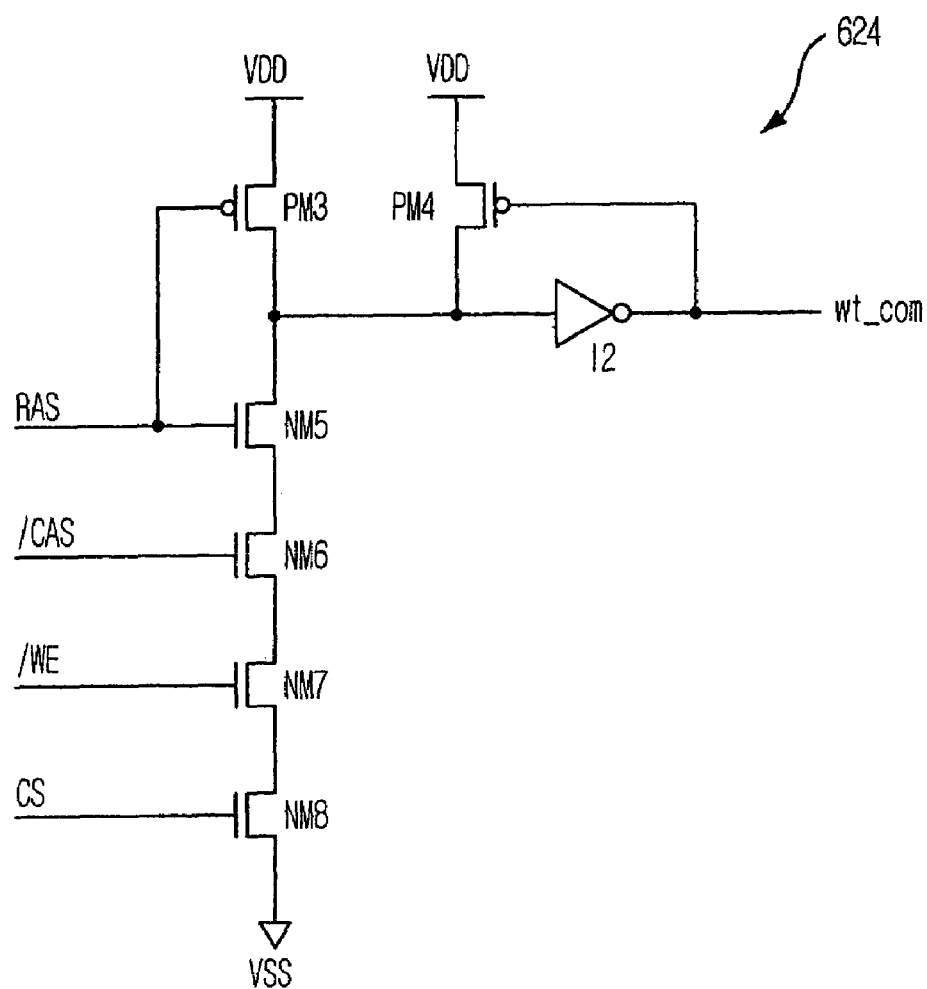
FIG. 5B shows a circuit diagram of the write command generation unit in accordance with the present invention

FIG. 5B is a circuit diagram of the write command generation unit in accordance with the present invention.

Referring to FIG. 5B, the write command generation unit 624 has a similar circuit structure to the read command generation unit 622. But, unlike the read command generation unit 622, in case that the RAS signal and the chip select signal CS are high level and the CAS bar signal /CAS and the write enable bar signal /WE are low level, the write command signal wt_com is activated.

In the command generation unit 620, a read signal RD and a write signal WT are inputted to the command generation unit 620 by combination of the RAS signal, the /CAS signal, the write enable signal WE and the chip selection signal CS, to thereby generate the read command signal rd_com and the write command signal wt_com, respectively.

Figure 6:
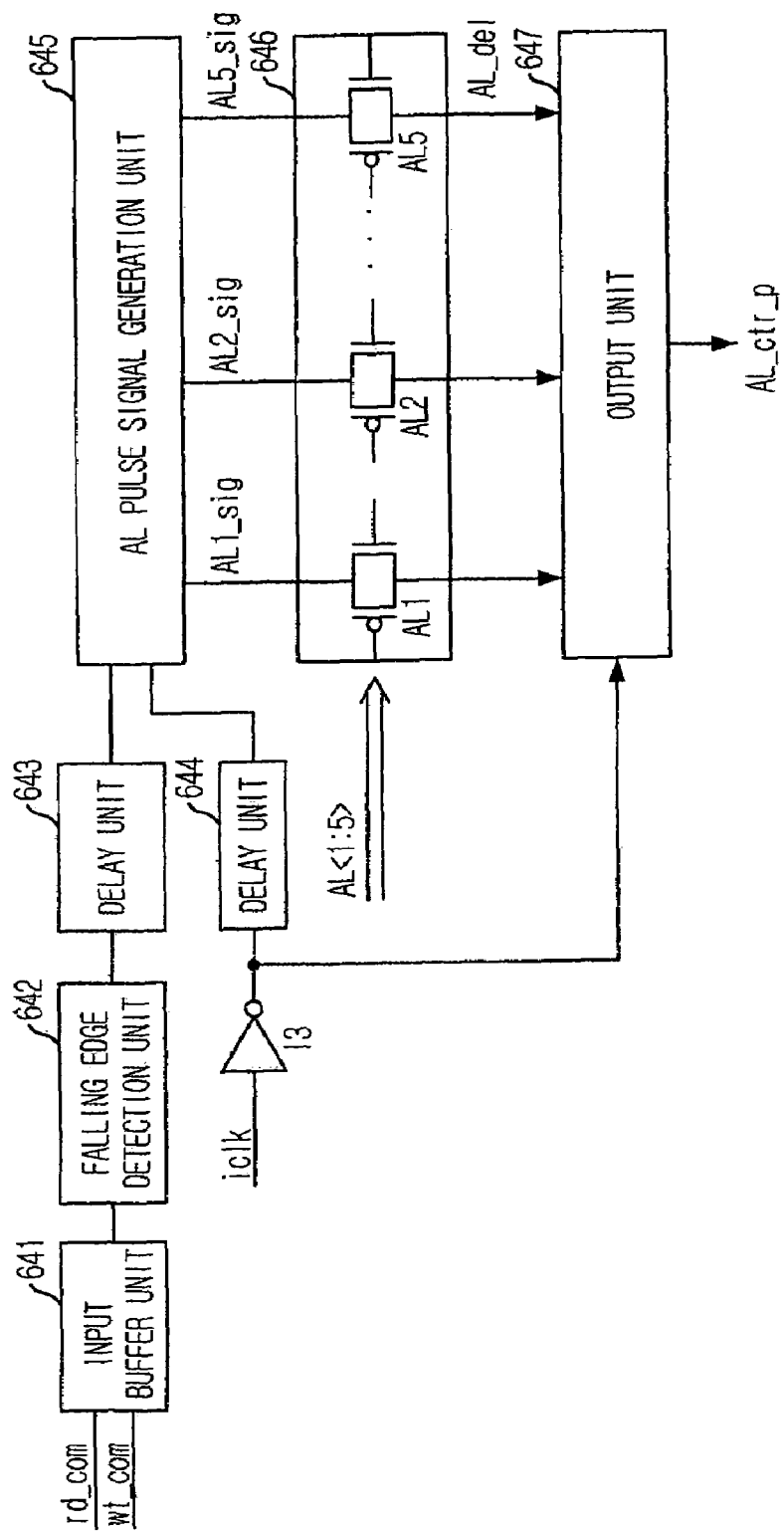
FIG. 6 is a block diagram of the AL driving signal generation unit in accordance with the present invention.

FIG. 6 is a block diagram of the AL driving signal generation unit 640 in accordance with the present invention.

Referring to FIG. 6, the AL driving signal generation unit 640 has an input unit 641 for receiving the read command signal rd_com and the write command signal wt_com, a falling edge detection unit 642 for detecting a falling edge of a signal outputted from the input unit 642, a first delay unit 643 for delaying an output signal of the falling edge detection unit 642 for a predetermined time, an inverter I3 for inverting the internal clock iclk, a second delay unit 644 for delaying an output signal of the inverter I3 for a predetermined time, an AL pulse signal generation unit 645, a selection unit 646, and an output unit 647. Herein, the AL pulse signal generation unit 645 generates a plurality of AL delay signals AL1_sig to AL5_sig with various pulse widths corresponding to the additive latency in response to the delayed signal outputted from the first delay unit 643. The selection unit 646 selects one signal among the AL delay signals AL1_sig to AL5_sig in response to the AL information signal AL<1:5>. The output unit 647 outputs an AL driving signal $AL_{13}$ ctr_p by sampling the internal clock iclk while the selected AL delay signal AL_del is activated.

The selection unit 646 is provided with a plurality of transfer gates, which transfer the AL delay signals AL1_sig to AL5_sig in response to the AL information signal AL<1:5>. In the present invention, since the signal outputted from the falling edge detection unit 642 and the delay unit 643, 644 for delaying the internal clock iclk are employed for securing a timing margin between the read/write command signal rd_com, wt_com and the internal clock iclk, they may be omitted if necessary.

Figure 7:
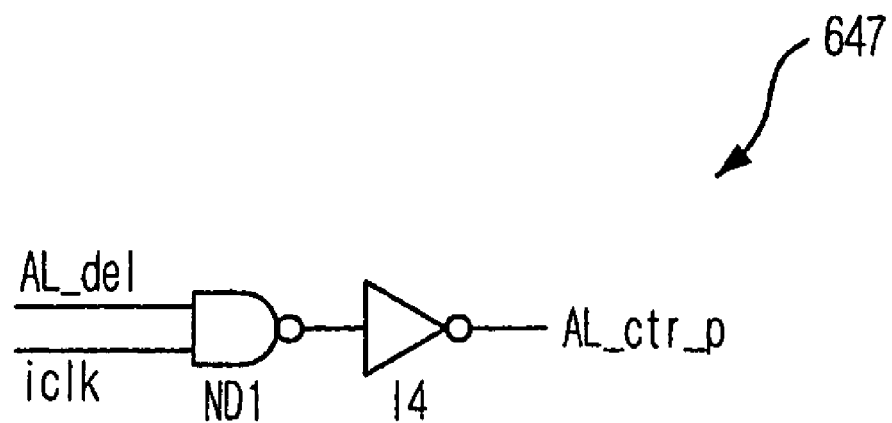
FIG. 7 is a circuit of the output unit for use in the AL driving signal generation unit in accordance with the present invention.

FIG. 7 is a circuit diagram of the output unit shown in FIG. 6 in accordance with the present invention.

Referring to FIG. 7, the output unit 647 has a NAND gate ND1 configured to receive the selected AL delay signal AL_del and the internal clock iclk and an inverter I4 for inverting an output signal of the NAND gate ND1 and outputting the AL driving signal AL_ctr_p. The output unit 647 performs a logic AND operation to the selected AL delay signal AL_del and the internal clock iclk, to thereby generate the AL driving signal AL_ctr_p with a pulse train after sampling the internal clock iclk during the activation period of the selected AL delay signal AL_del.

Figure 8:
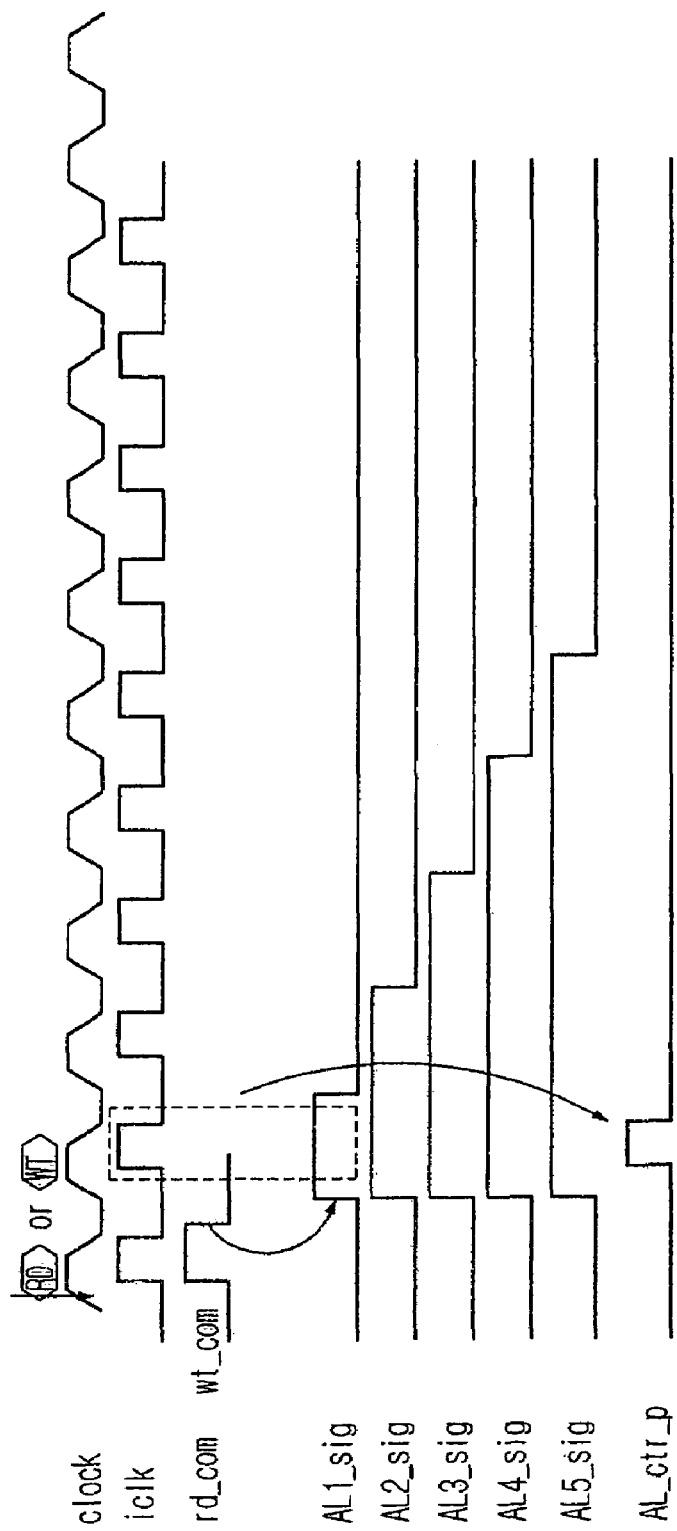
FIG. 8 is a timing diagram illustrating an operation of the AL driving signal generation unit shown in FIG. 6 in accordance with the present invention.

FIG. 8 is a timing diagram setting forth an operation of the AL driving signal generation unit 640 as shown in FIG. 6 in accordance with the present invention.

To begin with, the command generation unit 620 activates the read command signal rd_com in case that the external signal is the read signal. On the other hand, the command generation unit 620 activates the write command signal wt_com if the external signal is the write signal. Thereafter, the falling edge detection unit 642 detects an inactive state of the output signal of the input unit 641 and activates the output signal. Afterwards, the AL pulse signal generation unit 645 is enabled by the output signal of the falling edge detection unit 642 which is delayed at the first delay unit 643. The AL pulse signal generation unit 645 converts the internal clock iclk inputted from the second delay unit 644 into the AL delay signals AL0_sig to AL5_sig with the various pulse widths corresponding to the additive latency. In addition, the selection unit 646 selects one signal among the plurality of the AL delay signals AL0_sig to AL5_sig in response to the AL information signal AL<0:5> and outputs the AL delay signal AL_del. Subsequently, the output unit 647 generates the AL driving signal AL_ctr_p with pulse train by performing the logic AND operation to the selected AL delay signal AL_del and the internal clock iclk.

Figure 9:
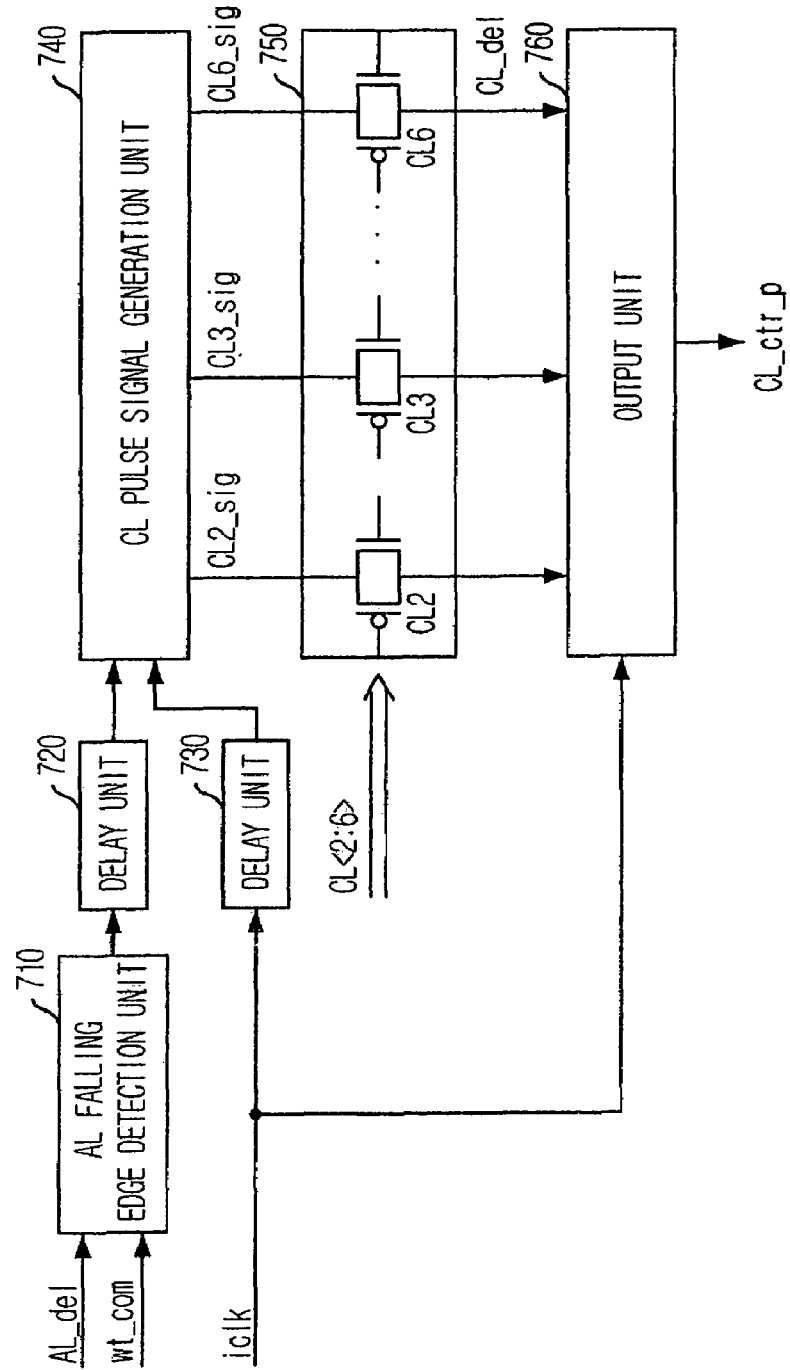
FIG. 9 is a block diagram of the CL driving control unit 700 in accordance with the present invention.

FIG. 9 is a block diagram of the CL driving control unit 700 in accordance with the present invention.

Referring to FIG. 9, the CL driving control unit 700 has an AL falling edge detection unit 710, a first delay unit 720 for delaying an output signal of the falling edge detection unit 710, a second delay unit 730 for delaying the internal clock iclk for a predetermined time, a CL pulse signal generation unit 740, a selection unit 750, and an output unit 760. Herein, the AL falling edge detection unit 710 is activated in response to the write command signal wt_com and detects a falling edge of the selected AL delay signal AL_del outputted from the AL driving signal generation unit 640. The CL pulse signal generation unit 740 generates a plurality of CL delay signals CL2_sig to CL6_sig with various pulse widths corresponding to the CAS latency, in response to the signal delayed at the first delay unit 720. In addition, the selection unit 750 selects one signal among the CL delay signals CL2_sig to CL6_sig and outputs a selected CL delay signal CL_del in response to a CL information signal CL<2:6>. The output unit 760 outputs a CL driving signal CL_ctr_p by sampling the internal clock iclk during the activation period of the selected CL delay signal CL_del.

Meanwhile, the selection unit 750 has a plurality of transfer gates, which output the CL delay signals CL2_sig to CL6_sig in response to the CL information signal CL<2:6>. In FIG. 9, the output signal of the AL falling edge detection unit 710 and each delay unit 720, 730 are employed for securing a timing margin among the write command signal wt_com, the AL delay signal AL_del and the internal clock iclk. Therefore, in some cases, the delay units 720 and 730 may be omitted.

Figure 10:
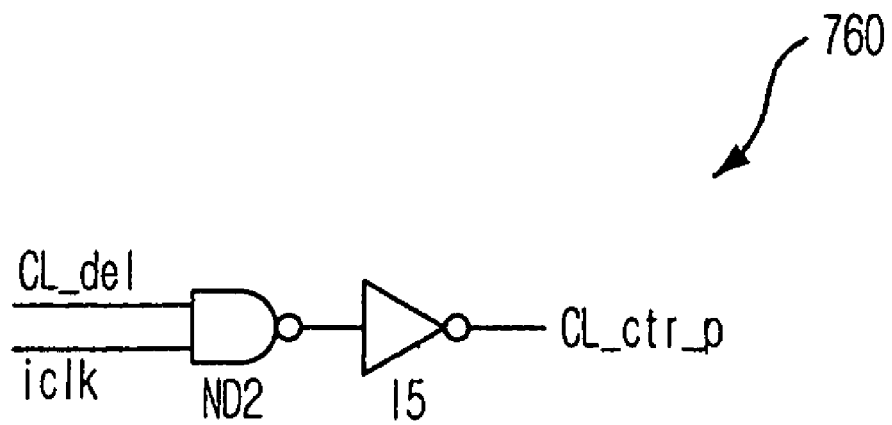
FIG. 10 is a circuit diagram of the output unit 760 in accordance with the present invention.

FIG. 10 is a circuit diagram of the output unit 760 in accordance with the present invention.

Referring to FIG. 10, the output unit 760 is provided with a NAND gate configured to receive the selected CL delay signal CL_del and the internal clock iclk, and an inverter I5 for inverting the selected CL delay signal CL_del and the internal clock iclk and outputting the CL driving signal CL_ctr_p.

Figure 11:
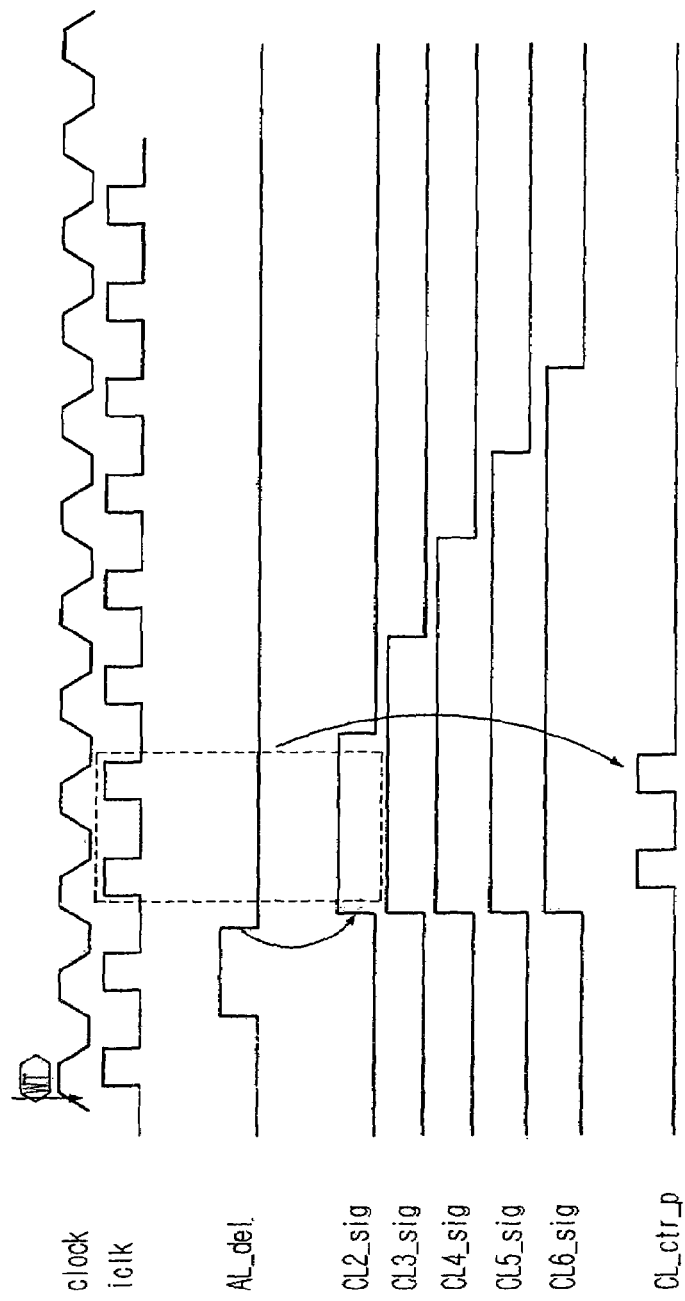
FIG. 11 is a timing diagram depicting an operation of the CL driving control unit 700 depicted in FIG. 9 in accordance with the present invention.

FIG. 11 is a timing diagram illustrating an operation of the CL driving control unit 700 as depicted in FIG. 9 in accordance with the present invention.

Referring to FIG. 11, to begin with, let us suppose that both the additive latency and the CAS latency are 1 and the inputted external signal is the write signal WT. The AL driving control unit 600 activates the selected AL delay signal AL_del. and the write command signal wt_com in response to the write signal WT. Thereafter, the AL falling edge detection unit 710 is activated in response to the write command signal wt_com and outputs an activated output signal in response to the falling edge of the selected AL delay signal AL_del.

Subsequently, the CL pulse signal generation unit 740 outputs the internal clock iclk inputted through the second delay unit 730 as a plurality of the CL delay signals CL2_sig to CL6_sig with various widths corresponding to the CAS latency, in response to the delayed signal outputted through the AL falling edge detection unit 710 and the first delay unit 720. The selection unit 750 selects one signal among the CL delay signals CL2_sig to CL6_sig in response to the CL information signal CL<2:6> and outputs the selected CL delay signal CL_del. Afterwards, the output unit 760 performs the logic AND operation to the selected CL delay signal CL_del and the internal clock iclk, to thereby output the CL driving signal CL_ctr_p with pulse train.

Referring back to FIG. 4, the operation of the semiconductor memory device having a column address path in accordance with the present invention will be set forth as a whole, hereinafter.

The command generation unit 620 receives the external signals such as the RAS signal, the CAS bar signal, the write enable signal WE and the chip select signal CD and outputs the write command signal wt_com and the read command signal rd_com. Then, the AL driving signal generation unit 640 generates the selected AL delay signal AL_del and the AL driving signal AL_ctr_p having the various pulse widths corresponding to the additive latency, wherein the AL information signal AL<1:5>, the read command signal rd_com and the write command signal wt_com are inputted thereto. The CL driving control unit 700 generates the CL driving signal CL_ctr_p in response to the write command signal wt_com, the selected AL delay signal AL_del and the CL information signal CL<2:6>.

The external column address Add inputted into the input buffer unit 120 is converted into the internal power level. Thereafter, the hold time and the setup time are controlled at the S/H control unit 142. Herein, the hold time and the setup time will inevitably happen while synchronizing the column address with the internal clock iclk. Then, the output address from the S/H control unit 142 is synchronized with the internal clock iclk at the internal clock synchronization unit 144. The output address from the latch unit 160 is outputted as the internal address yadd through the column latch unit 180 in case that the column latch unit 180 is enabled in response to the activated CAS signal casp6.

Afterwards, the AL flip-flop delay unit 200 outputs the internal column address yadd as the AL address yadd_AL, controlled by the AL driving signal AL_ctr_p. The CL flip-flop delay unit 300 outputs the AL address yadd_AL as the CL address yadd_CL, controlled by the CL driving signal CL_ctr_p. Next, the RD latch unit 400 outputs the AL address yadd_AL as the column address add_col when the read CAS signal casp6_rd is activated and the WT latch unit 500 outputs the CL address yadd_CL as the column address add_col when the write CAS signal casp6_wt is activated.

In the present invention, the AL flip-flop delay unit 200 and the CL flip-flop delay unit 300 are driven only during the predetermined period corresponding to the additive latency and the CAS latency respectively according to the write command signal wt_com and the read command signal rd_com. That is, when the read command signal rd com and the write command signal wt_com are inputted, the AL driving signal AL_ctr_p with the pulse train is inputted to the AL flip-flop delay unit 200 instead of the internal clock iclk, wherein the AL driving signal AL_ctr_p with the pulse train is achieved by a combination of the selected AL delay signal AL_del and the internal clock iclk. In case that the write command signal wt_com is activated, the CL driving signal CL_ctr_p is inputted to the CL flip-flop delay unit 300 instead of the internal clock iclk, wherein the CL driving signal CL_ctr_p is achieved by a combination of the internal clock iclk and the selected CL delay signal CL_del. Herein, the selected CL delay signal CL_del is activated in response to the falling edge of the selected AL delay signal AL_del and is kept to be activated for the delay time corresponding to the CAS latency.

In comparison with the conventional semiconductor memory device, the present invention provides an advantageous merit to reduce unnecessary power consumption. That is, since the inventive semiconductor memory device employs the AL driving control unit 600 and the CL driving control unit 700, the AL flip-flop delay unit 200 and the CL flip-flop delay unit 300 operate only for the predetermined time corresponding to the additive latency and the CAS latency, to thereby reduce the unnecessary power consumption incurred by an unnecessary operation of the delay units 200, 300.

Meanwhile, in the present invention, though the row address and the column address share a portion of the address path, the inventive semiconductor memory device can also be utilized in case that they does not share the address path at all.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    an internal column address generation means for receiving an external column address and generating an internal column address;
    a delay means for delaying the internal column address for a predetermined time changed in response to a preset latency; and
    a driving control means for driving the delay means during the predetermined time which corresponds to the preset latency.

2. The semiconductor memory device as recited in claim 1, wherein the delay means comprises:
    a first flip-flop delay means for delaying the internal column address for a first predetermined time corresponding to an additive latency (AL), thereby outputting a first delayed column address; and
    a second flip-flop delay means for delaying the first delayed column address for a second predetermined time corresponding to a column address strobe (CAS) latency, thereby outputting a second delayed column address.

3. The semiconductor memory device as recited in claim 2, wherein the driving control means comprises:
    a first driving control means for driving the first flip-flop delay means for the first predetermined time corresponding to the additive latency after a read command signal or a write command signal; and
    a second driving control means for driving the second flip-flop delay means for the second predetermined time corresponding to the CAS latency after the first predetermined time corresponding to the additive latency.

4. The semiconductor memory device as recited in claim 3, further comprising:
    a read latch means for latching and outputting an output signal of the first flip-flop delay means in response to a read CAS signal; and
    a write latch means for latching and outputting an output signal of the second flip-flop delay means in response to a write CAS signal.

5. The semiconductor memory device as recited in claim 4, wherein the read latch means and the write latch means have a common output node.

6. The semiconductor memory device as recited in claim 3, wherein the first driving control means comprises:
    a command generation unit for generating the read command signal and the write command signal in response to an external command signal and a control signal; and
    a driving signal generation unit for generating a first driving signal to control the first flip-flop delay means in response to the read command signal or the write command signal, the internal clock and an additive latency information signal.

7. The semiconductor memory device as recited in claim 6, wherein the second driving control means generates a second driving signal to control the second flip-flop delay means in response to the write command signal, the internal clock, a CAS latency information signal and a signal with a predetermined pulse width which corresponds to the additive latency.

8. The semiconductor memory device as recited in claim 3, wherein the first driving control means comprises:
    a command generation unit for generating the read command signal or the write command signal in response to the external command signal and the control signal;
    an input unit for receiving the read command signal and the write command signal;
    a first falling edge detection unit for detecting a falling edge of a signal outputted from the input unit;
    an additive latency pulse signal generation unit for receiving an output signal of the first falling edge detection unit and generating signals with predetermined pulse widths corresponding to a plurality of additive latencies;
    a first selection unit for selecting one signal among the plurality of signals outputted from the additive latency pulse signal generation unit in response to the additive latency information signal; and
    a first output unit for outputting the first driving signal to control the first flip-flop delay means by a combination of the internal clock and the output signal of the first selection unit.

9. The semiconductor memory device as recited in claim 8, wherein the second driving control means comprises:
    a second falling edge detection unit for detecting an falling edge of the signal outputted from the first selection unit by using the write command signal as an enable signal;
    a CAS latency pulse signal generation unit for receiving the output signal of the second falling edge detection unit and generating signals with pulse widths corresponding to a plurality of CAS latencies;
    a second selection unit for selecting one signal among the plurality of signals outputted from the CAS latency pulse signal generation unit in response to a CAS information signal; and
    a second output unit for outputting the second driving signal to control the second flip-flop delay means by a combination of the internal clock and the output signal of the second selection unit.

10. The semiconductor memory device as recited in claim 9, wherein the second selection unit is provided with a plurality of transfer gates for transmitting the output signal of the CAS latency pulse signal generation unit, the plurality of transfer gates being controlled by a plurality of CAS latency information signals.

11. The semiconductor memory device as recited in claim 9, wherein the second output unit is provided with a second NAND gate receiving the output signal of the second selection unit and the internal clock, and a second inverter for inverting the output signal of the second NAND gate and outputting the second driving signal to control the second flip-flop delay means.

12. The semiconductor memory device as recited in claim 8, wherein the first selection unit is provided with a plurality of transfer gates for transmitting the output signal of the additive latency pulse signal generation unit, the plurality of transfer gates being controlled by a plurality of additive latency information signals.

13. The semiconductor memory device as recited in claim 8, wherein the first output unit is provided with a first NAND gate receiving the output signal of the first selection unit and the internal clock, and a first inverter for inverting the output signal of the first NAND gate and outputting the first driving signal to control the first flip-flop delay means.

14. The semiconductor memory device as recited in claim 8, wherein the command generation unit is provided with a write command generation circuit and a read command generation circuit which are separately disposed in the command generation unit.

15. The semiconductor memory device as recited in claim 14, wherein the read command generation circuit comprises:
   a first PMOS transistor having a source-to-drain path between a first power supply voltage and a node, a gate of the first PMOS transistor receiving a RAS signal;
   an inverter for inverting a node signal to thereby output the read command signal;
   a second PMOS transistor having a source-to-drain path between the first power supply voltage and the node, a gate of the second PMOS transistor receiving the read command signal; and
   a first to a fourth NMOS transistors coupled in series, gates of the first to fourth NMOS transistors receiving the RAS signal, a CAS bar signal, the write enable signal and a chip select signal, respectively.

16. The semiconductor memory device as recited in claim 14, wherein the write command generation circuit comprises:
   a first PMOS transistor having a source-to-drain path between a first power supply voltage and a node, a gate of the first PMOS transistor receiving a RAS signal;
   an inverter for inverting a node signal to thereby output the read command signal;
   a second PMOS transistor having a source-to-drain path between the first power supply voltage and the node, a gate of the second PMOS transistor receiving the write command signal; and
   a first to a fourth NMOS transistors coupled in series, gates of the first to fourth NMOS transistors receiving the RAS signal, a CAS bar signal, a write enable bar signal and a chip select signal, respectively.

17. The semiconductor memory device as recited in claim 1, wherein the internal column address generation means comprises:
   an input buffer unit for converting an input address into an internal power level;
   an address alignment unit for aligning an output signal of the input buffer unit in synchronization with the internal clock;
   a latch unit for latching an output signal of the address alignment unit; and
   a column latch unit for latching and outputting the output signal of the latch unit as the column address in response to the CAS signal.

* * * * *